(12) United States Patent
Lee et al.

(10) Patent No.: US 12,431,475 B2
(45) Date of Patent: Sep. 30, 2025

(54) METHOD OF REPAIRING A DISPLAY PANEL AND REPAIRED DISPLAY PANEL

(71) Applicant: SEOUL SEMICONDUCTOR CO., LTD., Gyeonggi-do (KR)

(72) Inventors: Woo Gun Lee, Gyeonggi-do (KR); Young Il Go, Gyeonggi-do (KR); Youngsik Ki, Gyeonggi-do (KR); Seung Sik Hong, Gyeonggi-do (KR)

(73) Assignee: Seoul Semiconductor Co., Ltd., Gyeonggi-do (KR)

( * ) Notice: Subject to any disclaimer, the term of this patent is extended or adjusted under 35 U.S.C. 154(b) by 693 days.

(21) Appl. No.: 17/838,507

(22) Filed: Jun. 13, 2022

(65) Prior Publication Data

US 2022/0399317 A1    Dec. 15, 2022

Related U.S. Application Data

(60) Provisional application No. 63/349,704, filed on Jun. 7, 2022, provisional application No. 63/210,307, filed on Jun. 14, 2021.

(51) Int. Cl.
*H01L 25/13*    (2006.01)
*H01L 23/00*    (2006.01)
(Continued)

(52) U.S. Cl.
CPC ............ *H01L 25/13* (2013.01); *H01L 25/167* (2013.01); *H10H 20/853* (2025.01); *H01L 24/05* (2013.01);
(Continued)

(58) Field of Classification Search
CPC ....... H01L 25/13; H01L 25/167; H01L 24/05; H01L 24/27; H01L 24/29; H01L 24/32;
(Continued)

(56) References Cited

U.S. PATENT DOCUMENTS 9,111,464 B2    8/2015    Bibl et al.
9,484,504 B2    11/2016   Bibl et al.
(Continued)

FOREIGN PATENT DOCUMENTS

KR    1020190108768 A    9/2019
KR    1020200135069 A    12/2020
KR    1020210006241 A    1/2021

OTHER PUBLICATIONS

International Search Report for PCT/KR2022/008404, Oct. 7, 2022, 4 pages.
(Continued)

*Primary Examiner* — Herve-Louis Y Assouman
(74) *Attorney, Agent, or Firm* — LaBatt, LLC

(57) ABSTRACT

A method of repairing a display panel and a repaired display panel are provided. The display panel includes a panel substrate, a plurality of micro LEDs arranged on the panel substrate, and a molding member covering the plurality of micro LEDs. The molding member includes a first molding member and a second molding member disposed in a region surrounded by the first molding member. The second molding member has a composition or a shape different from that of the first molding member, and the second molding member surrounds at least one side surface of the plurality of micro LEDs.

20 Claims, 5 Drawing Sheets

(51) Int. Cl.
*H01L 25/16* (2023.01)
*H10H 20/853* (2025.01)
H10H 20/01 (2025.01)

(52) U.S. Cl.
CPC .............. *H01L 24/27* (2013.01); *H01L 24/29* (2013.01); *H01L 24/32* (2013.01); *H01L 24/83* (2013.01); *H01L 24/98* (2013.01); *H01L 2224/05567* (2013.01); *H01L 2224/05573* (2013.01); *H01L 2224/27602* (2013.01); *H01L 2224/29006* (2013.01); *H01L 2224/2929* (2013.01); *H01L 2224/29309* (2013.01); *H01L 2224/29311* (2013.01); *H01L 2224/29316* (2013.01); *H01L 2224/29318* (2013.01); *H01L 2224/29324* (2013.01); *H01L 2224/29347* (2013.01); *H01L 2224/32145* (2013.01); *H01L 2224/32227* (2013.01); *H01L 2224/83224* (2013.01); *H01L 2224/83801* (2013.01); *H01L 2224/98* (2013.01); *H01L 2924/0132* (2013.01); *H01L 2924/12041* (2013.01); *H10H 20/034* (2025.01); *H10H 20/0362* (2025.01)

(58) Field of Classification Search
CPC ...................... H01L 24/83; H01L 24/98; H01L 2224/05567; H01L 2224/05573; H01L 2224/27602; H01L 2224/29006; H01L 2224/2929; H01L 2224/29309; H01L 2224/29311; H01L 2224/29316; H01L 2224/29318; H01L 2224/29324; H01L 2224/29347; H01L 2224/32145; H01L 2224/32227; H01L 2224/83224; H01L 2224/83801; H01L 2224/98; H01L 2924/0132; H01L 2924/12041; H01L 2224/92; H01L 25/0753; H10H 20/853; H10H 20/034; H10H 20/0362; H10H 20/854; H10H 20/855

See application file for complete search history.

(56) References Cited

U.S. PATENT DOCUMENTS

| | | | |
|---|---|---|---|
| 2018/0076368 A1* | 3/2018 | Hussell | ............... H01L 25/0753 |
| 2019/0244938 A1* | 8/2019 | Bang | .................... H10H 20/857 |
| 2020/0058834 A1* | 2/2020 | Park | ...................... H10D 86/60 |
| 2020/0161514 A1 | 5/2020 | Hwang et al. | |
| 2021/0013259 A1 | 1/2021 | Ahn et al. | |
| 2022/0223754 A1 | 7/2022 | Ahn et al. | |

OTHER PUBLICATIONS

Extended European search report for European Patent Application No. 22825280.5, Apr. 25, 2025, 10 pages.

\* cited by examiner

METHOD OF REPAIRING A DISPLAY PANEL AND REPAIRED DISPLAY PANEL

CROSS-REFERENCE OF RELATED APPLICATIONS AND PRIORITY

The Present Application is a non-provisional application which claims priority to and benefit of U.S. Provisional Applications Nos. 63/210,307 filed Jun. 14, 2021 and 63/349,704 filed Jun. 7, 2022, the disclosure of which are incorporated by reference as if they fully set forth herein.

TECHNICAL FIELD

The present disclosure relates to a display panel and a manufacturing method thereof, and more particularly, to a display panel for repairing a defective pixel and a manufacturing method thereof.

BACKGROUND

A light emitting device is a semiconductor device using a light emitting diode as an inorganic light source, which is used in various fields such as display apparatuses, vehicle lamps, and general lighting devices. The light emitting diode has advantages such as longer lifespan, lower power consumption, and higher response speed than that of conventional light sources, and thus has been rapidly replacing the conventional light sources.

A typical light emitting device has been mainly used as a backlight unit for display devices. However, a display device that displays images using a light emitting diode has been recently developed. Such a display device is also generally referred to as a micro-LED display.

In general, a display apparatus displays various colors by mixing blue, green, and red light. A display apparatus implementing a micro-LED display includes multiple pixels so as to realize various images, and each of the pixels includes blue, green, and red sub-pixels. As such, a color of a specific pixel is typically determined based on the colors of these sub-pixels, and an image can be realized by combination of these pixels.

LEDs can emit light of various colors depending on a material thereof. A display panel may be provided by arranging individual micro LEDs emitting blue, green, and red on a two-dimensional plane, or alternatively, arranging micro LEDs of a stacked structure. The stacked structure of micro LEDs includes blue LEDs, green LEDs, and red LEDs that are stacked on a two-dimensional plane. The display panel may be assembled into a display apparatus. In general, for various purposes such as protecting the micro LEDs from an external environment or improving a contrast ratio, the micro LEDs mounted on the display panel are covered with a transparent molding portion or a molding member such as a black matrix.

After a molding process, which is the last step of a manufacturing process of the display panel, is completed, one or more undesirable micro LEDs may be discovered in the display panel. At this stage, it is difficult to repair the undesirable micro LEDs, and thus, the display panel may be discarded and cost loss occurs.

SUMMARY

Exemplary embodiments of the present disclosure provide a method of repairing a display panel in which a molding process is completed and a repaired display panel.

A display panel according to an exemplary embodiment of the present disclosure includes a panel substrate, a plurality of micro LEDs arranged on the panel substrate, and a molding member covering the plurality of micro LEDs. The molding member includes a first molding member and a second molding member disposed in a region surrounded by the first molding member. The second molding member has a composition or a shape different from that of the first molding member, and the second molding member surrounds at least one side surface of the plurality of micro LEDs.

In at least one variant, a light transmittance of the second molding member may be higher than that of the first molding member.

In another variant, a height of an upper surface of the second molding member may be lower than that of an upper surface of the first molding member.

In another variant, the display panel may further include a film covering the second molding member, in which the film may be disposed in the region surrounded by the first molding member, and a height of an upper surface of the film may be substantially equal to that of the upper surface of the first molding member.

In another variant, the first molding member and the film may include anti-glare layers on surfaces thereof.

In another variant, the anti-glare layer disposed on the surface of the first molding member may be spaced apart from the anti-glare layer disposed on the surface of the film.

In another variant, the display panel may include a plurality of pixels, the plurality of pixels may have a structure in which the micro LEDs are modularized, respectively, and the second molding member may cover at least one side surface of the pixels.

In another variant, the plurality of pixels may include a replacement pixel, and the second molding member may cover side surfaces of the replacement pixel.

In another variant, the display panel may further include a film covering the second molding member, in which the film may be disposed in the region surrounded by the first molding member, and a height of an upper surface of the film may be substantially equal to that of the upper surface of the first molding member.

In another variant, the display panel may further include conductive bonding portions for bonding the pixels to the panel substrate, and bonding portions under the replacement pixel may be thicker than bonding portions under other pixels.

In another variant, an upper surface of the replacement pixel may be placed higher than upper surfaces of other pixels.

A display panel according to an exemplary embodiment of the present disclosure includes a panel substrate, a plurality of LED pixels arranged on the panel substrate, and a molding member covering the plurality of LED pixels. The molding member has a plurality of layers in at least one LED pixel region of the plurality of LED pixels. The plurality of layers of the molding member includes a first layer and a second layer disposed over the first layer, and a composition or a shape of a partial region of the second layer is different from a composition or a shape of the first layer.

In at least one variant, the LED pixel may include a plurality of micro LEDs, and the first layer may be in contact with at least one side surface of the plurality of micro LEDs.

In another variant, a region over the second layer may include a haze treatment region.

In another variant, the second layer may include an upper layer and a lower layer, and the lower layer may include a substantially identical material as that of the first layer.

In another variant, the upper layer may include a haze treatment region.

In another variant, the upper layer may include an anti-glare film.

In another variant, the upper layer and the lower layer may be formed to have different thicknesses.

A haze value of the haze treatment region may be smaller than or equal to 30%. The lower layer may have a substantially identical light transmittance or light shielding rate as that of the first layer.

DESCRIPTION OF DRAWINGS

FIG. 1 is a schematic cross-sectional view illustrating a display panel in which forming a molding member is completed.

FIG. 2 is a schematic cross-sectional view illustrating a process of removing a molding member at an upper portion of a defective pixel.

FIG. 3 is a schematic cross-sectional view illustrating a process of removing a defective pixel.

FIG. 4 is a schematic cross-sectional view illustrating a process of planarizing a bonding portion after removing the defective pixel.

FIG. 5 is a schematic cross-sectional view illustrating a process of forming a bonding agent for mounting a replacement pixel.

FIG. 6 is a schematic cross-sectional view illustrating a process of mounting the replacement pixel.

FIG. 7 is a schematic cross-sectional view illustrating a process of forming a molding agent.

FIG. 8 is a schematic cross-sectional view illustrating a process of attaching a film.

FIG. 9 is a schematic cross-sectional view illustrating a process of curing a molding agent using ultraviolet rays.

DETAILED DESCRIPTION OF EMBODIMENTS

Figure 1:
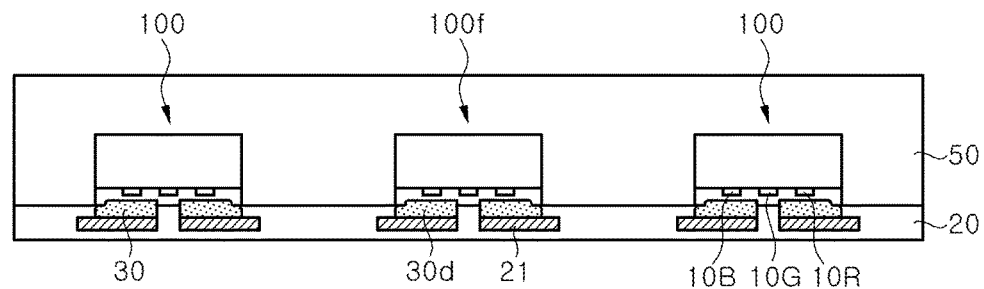
FIGS. 1 through 9 are schematic cross-sectional views illustrating a method of repairing a display panel according to an exemplary embodiment of the present disclosure, where.

Hereinafter, exemplary embodiments of the present disclosure will be described in detail with reference to the accompanying drawings. The following exemplary embodiments are provided by way of example so as to fully convey the spirit of the present disclosure to those skilled in the art to which the present disclosure pertains. Accordingly, the present disclosure is not limited to the exemplary embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A display apparatus using micro LEDs may be applied to various applications such as a smart watch, a virtual reality (VR) display apparatus, an AR (augmented reality) display apparatus, an electronic Signage, a micro LED TV, or others.

The display apparatus includes a display panel including micro LEDs. A large number of micro LEDs may be mounted on a panel substrate. Micro LEDs may be transferred to the panel substrate in a group. After the micro LEDs are mounted on the panel substrate, undesirable micro LEDs may be generated. There may be defects in the micro LEDs themselves or defects generated during a mounting process. For example, a defective pixel may be formed, such as a dead pixel in which all of RGB sub-pixels do not work so that the pixel is displayed as black, a hot pixel in which all of the RGB sub-pixels work together so that the pixel is displayed as white, or a stuck pixel in which one or two of the RGB sub-pixels do not work so that the pixel is displayed in a specific color. When a defective pixel is discovered, the display panel may be repaired by removing a micro LED forming the defective pixel and mounting a replacement micro LED in the removed location.

However, even after a molding process, which is a final step of the display panel, a failure may occur in the micro LED. Since the pixel or the micro LED is covered with a molding member, at that stage, it is difficult to repair the display panel. Accordingly, an entire display panel having defective pixels was replaced with a new display panel. As a result, a large amount of cost is lost due to the replacement of the display panel. In particular, a size of the micro LED is very small. Therefore, it is necessary to repair the display panel having defective pixels even after the molding process.

FIGS. 1 through 9 are schematic cross-sectional views illustrating a method of repairing a display panel according to an exemplary embodiment of the present disclosure.

Referring to FIG. 1, a display panel is prepared. The display panel includes a panel substrate 20 having pads 21, pixels 100 and 100$f$ having micro LEDs 10B, 10G, and 10R, bonding portions 30, and a molding member 50.

The panel substrate 20 may be a printed circuit board having a circuit therein. The panel substrate 20 may include a passive circuit and/or active circuit. The pads 21 for mounting the pixels 100 may be exposed on a surface of the panel substrate 20.

The pixels 100 and 100$f$ are mounted on the panel substrate 20. The pixels 100 and 100$f$ may be bonded to the pads 21 through the bonding portions 30. The pixels 100 and 100$f$ may be bonded to the pads 21 by the bonding portions 30 of identical components. The pixels 100 and 100$f$ may be transferred onto the panel substrate 20 in a group using a transferring technique. The bonding portions 30 secure the pixels 100 and 100$f$ to the panel substrate 20, and electrically connect a circuit on the panel substrate 20 and the pixels 100 and 100$f$. The bonding portions 30 may be formed of conductive materials, and may be formed of a material that can be cured or sintered by heat. The bonding portion 30 may be formed using a solder paste. The solder paste may be formed by mixing a powder including one of metals such as Al, Cu, Sn, Au, Zn, Pb, and In, mixture or alloy of at least two thereof and having an average particle diameter of about 0.1 micrometers to about 10 micrometers and a binder resin having adhesion. However, the bonding portion 30 is not limited to being formed of the solder paste, and may be formed using various conductive bonding agents. For example, the bonding portions 30 may be formed using a bonding metal such as AuSn.

After the pixels 100 and 100f are disposed, the bonding portion 30 may be formed through various methods such as a reflow process, a thermo compression process, and others.

The pixels 100 and 100f may be arranged in various shapes on the panel substrate 20. For example, the pixels 100 and 100f may be arranged in a matrix form. The pixel 100f has an identical structure as that of the pixel 100, but the pixel 100f indicates a defective pixel that has a failed operation or a failed mounting for description of the embodiments. In the drawings, three pixels 100 and 100f are shown, but this is only by way of an example, and a larger number, for example, 1000 or more, further, 10000 or more pixels may be arranged on the panel substrate 20.

Each pixel 100 includes a plurality of micro LEDs 10B, 10G, and 10R. For example, each pixel 100 may include a blue micro LED 10B, a green micro LED 10G, and a red micro LED 10R. Each of the micro LEDs 10B, 10G, and 10R may correspond to a sub-pixel, and may be referred to as a sub-pixel herein. Each pixel 100 may realize light of various colors using these micro LEDs 10B, 10G, and 10R.

In the illustrated exemplary embodiment, the plurality of micro LEDs 10B, 10G, and 10R is modularized into the pixel 100 and mounted on the panel substrate 20. Since the pixel 100 is mounted on the panel substrate 20, a process of mounting the LEDs may be simplified compared to when individual micro LEDs 10B, 10G, and 10R are mounted on the panel substrate 20, respectively. However, the inventive concepts are not limited thereto, and the micro LEDs 10B, 10G, and 10R may be directly mounted on the panel substrate 20.

In addition, although the pixel 100 is described as including micro LEDs 10B, 10G, and 10R that are laterally spaced apart from one another in the illustrated exemplary embodiment, a structure of the pixel 100 is not particularly limited as long as it includes sub-pixels emitting light of different colors. For example, the pixel 100 may have a stacked structure in which blue, green, and red sub-pixels overlap one another.

The molding member 50 covers the pixels 100. The molding member 50 may be formed using a transparent molding agent such as silicone or epoxy. The molding member 50 may have a single-layer structure or a multi-layer structure. The molding member 50 may be formed of a black matrix (BM), a photosensitive resin composition, or a resin composition including a black pigment for light shielding. The molding member 50 may further include an anti-static agent so as to prevent electro-static discharge (ESD). In addition, the molding member 50 may include an anti-glare layer on a surface thereof so as to prevent glare. The molding member 50 may be formed to have a thickness of about 350 μm from an upper surface of the panel substrate 20, and may cover upper surfaces of the pixels 100 and 100f. For example, the pixels 100 and 100f may have thicknesses smaller than that of the molding member 50, for example, about 100 μm to about 170 μm.

When the defective pixel 100f is discovered before forming the molding member 50, the defective pixel 100f may be replaced with a replacement pixel 100. However, the defective pixel 100f may be discovered after the molding member 50 is formed, or after the display panel starts to be driven. The defective pixel 100f may also happen while driving the display panel.

The defective pixel 100f may occur in various forms. For example, at least one of the micro LEDs 10B, 10G, and 10R may not be lit, and they may be lit together undesirably.

Figure 2:
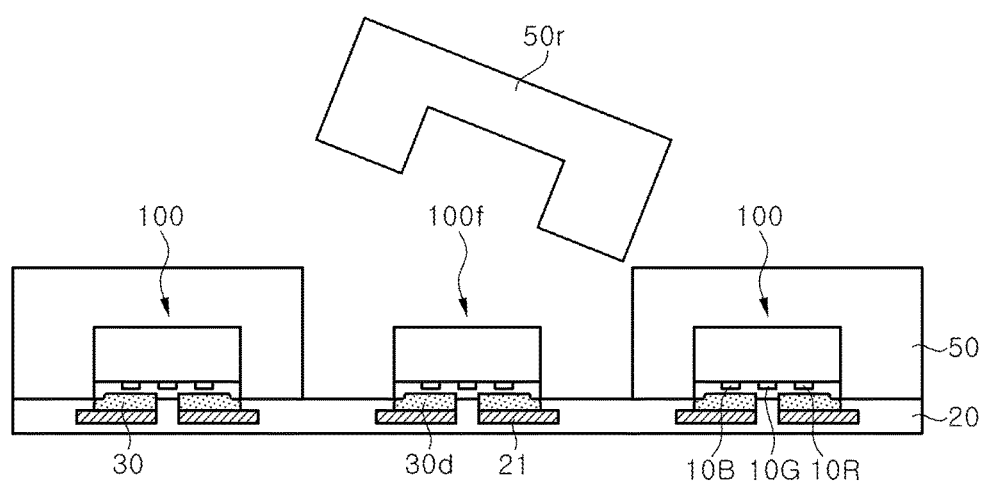

Referring to FIG. 2, when the defective pixel 100f is discovered and identified, the molding member 50 is partially removed to expose the pixel 100f. After identifying a location of the defective pixel 100f, a partial region of the molding member 50 corresponding to an area equal to or greater than that of the defective pixel 100f is removed. A removed portion of the molding member 50 may be referred to as a removed molding member 50r. A region of the removed molding member 50r may be within a region surrounded by the pixels 100 adjacent to the pixel 100f. That is, the pixels 100 adjacent thereto other than the pixel 100f may still be covered with the molding member 50. However, the inventive concepts are not limited thereto. For example, the removed molding member 50r may have an area encompassing the pixel 100f and other pixels 100 around the pixel 100f. In this case, at least one pixel 100 adjacent to the pixel 100f may be exposed together with the pixel 100f.

The molding member 50 may be partially removed using cutting, grinding, or etching techniques. For example, after cutting the molding member 50 using a micro-end mill, a laser, or an ultrasonic wave, the removed molding member 50r may be lifted. Alternatively, the molding member 50 may be partially removed using photolithography, or using an etching technique, a plane milling technique, or the like.

Figure 3:
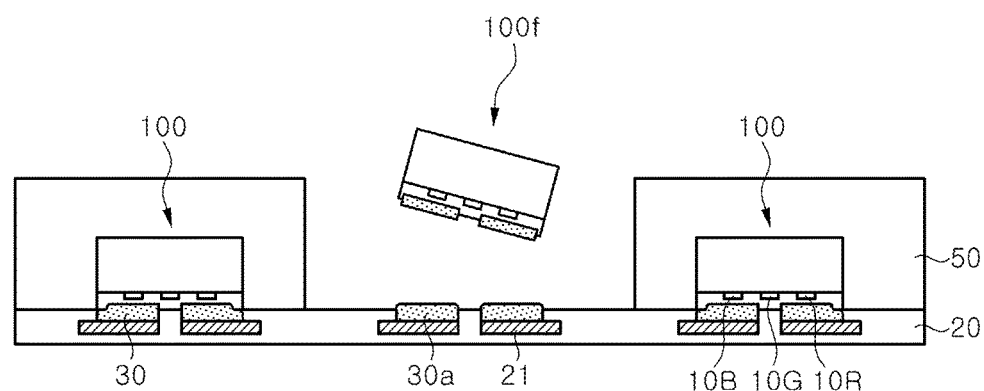

Referring to FIG. 3, an exposed pixel 100f is removed. The pixel 100f may be separated from the panel substrate 20 by irradiating a laser to the bonding portion 30 for bonding the pixel 100f and the pad 21. After the pixel 100f is separated, a portion 30a of the bonding portion 30 may remain on the panel substrate 20.

Figure 4:
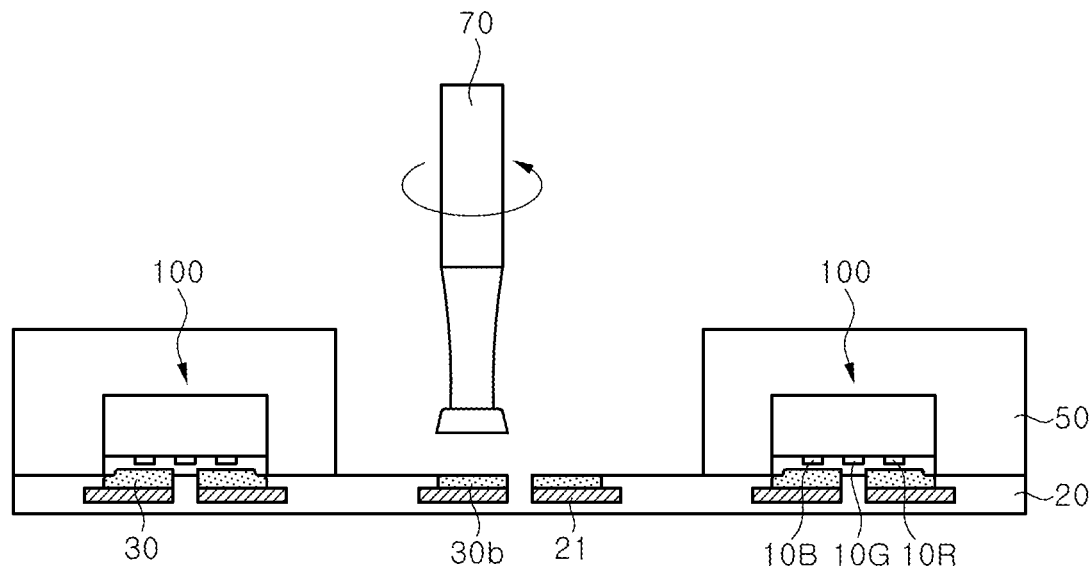

Referring to FIG. 4, a bonding portion 30b having a flat upper surface may be formed by planarizing the bonding portion 30a remaining on the panel substrate 20. The bonding portions 30a have roughened upper surfaces by laser irradiation while separating the pixel 100f. Accordingly, when the pixel is mounted thereon, not only a bonding failure of the pixel may occur, but also the pixel may be inclined. To prevent this, the upper surface of the bonding portion 30a is planarized.

The bonding portion 30b having a flat upper surface may be formed by cutting the upper surface of the bonding portion 30a using a micro-end mill 70. Heights of the panel substrate 20 and the bonding portion 30b may be equally adjusted by cutting the bonding portion 30a together with the panel substrate 20 there around. Computerized numerical control (CNC) technology may be used together to increase precision.

Figure 5:
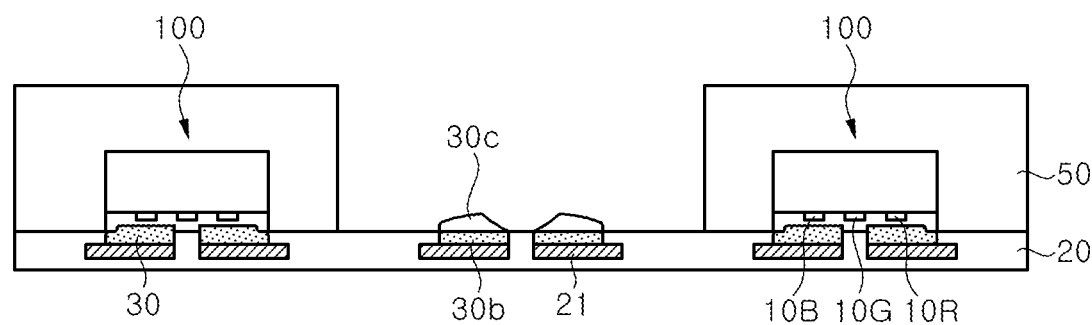

Referring to FIG. 5, a bonding agent 30c is dotted on the bonding portions 30b. The bonding agent 30c may be dotted on each bonding portion 30b using a pin dotting method or the like. The bonding agent 30c may include solder. For example, the bonding agent 30c may be a solder paste, without being limited thereto.

Figure 6:
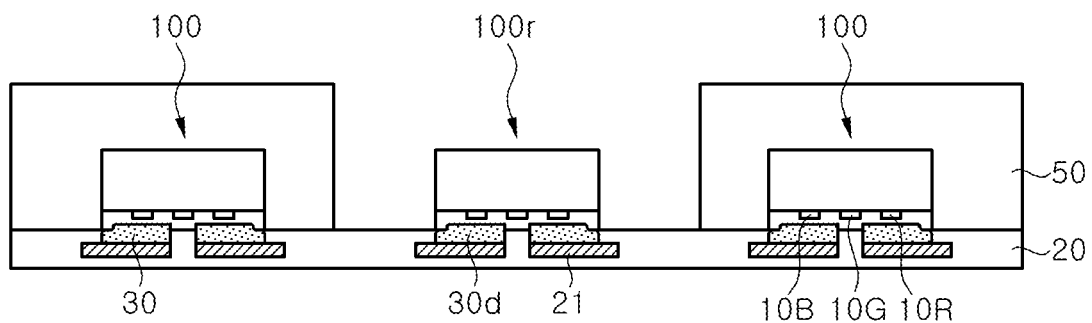

Referring to FIG. 6, a replacement pixel 100r is mounted on the panel substrate 20. The replacement pixel 100r may include the micro LEDs 10B, 10G, and 10R like the pixel 100. The replacement pixel 100r may have an identical structure as that of the pixel 100, without being limited thereto. The replacement pixel 100r may be disposed on the bonding agent 30c, as shown in FIG. 5, and the replacement pixel 100r may be bonded to the pads 21 by applying energy to the bonding agent 30c using a laser. The bonding agent 30c may be combined with a remaining bonding portion 30b to form a bonding portion 30d.

Figure 7:
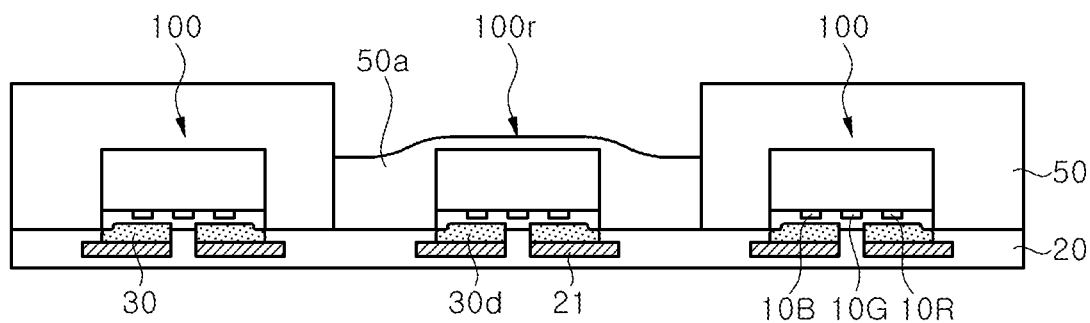

Referring to FIG. 7, a molding agent 50a covering the replacement pixel 100r is applied. The molding agent 50a may be applied on the replacement pixel 100r using a dotting technique. The molding agent 50a may be applied in a smaller volume than the removed molding member 50r. Accordingly, an upper surface of the molding agent 50a may be placed lower than an upper surface of the molding member 50. The molding agent 50a may completely cover an upper surface of the replacement pixel 100r, but the inventive concepts are not limited thereto. At least a portion of the upper surface of the replacement pixel 100r may be exposed without being covered with the molding agent 50a. The molding agent 50a may be a transparent material such as silicone or epoxy, without being limited thereto, may be black molding, and may include a filler material capable of improving a light transmittance. The molding agent 50a may be formed of a curable material.

Figure 8:
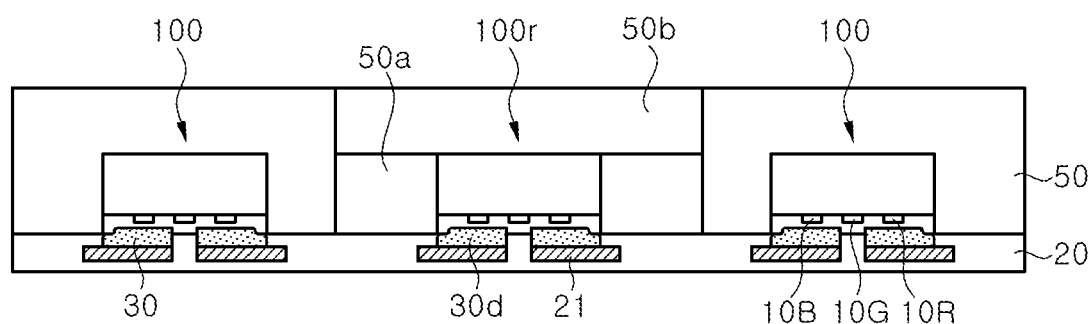

Referring to FIG. 8, a film 50b is disposed on the molding agent 50a. The film 50b is inserted into the region of the removed molding member 50r. The film 50b may have a substantially identical area as that of the removed molding member 50r. The film 50b may have a flat upper surface and a flat lower surface, and may deform the molding agent 50a by applying pressure to the film 50b. The upper surface of the film 50b may be disposed on a substantially identical location as that of an upper surface of an adjacent molding member 50.

As shown in FIG. 8, the film 50b may be in contact with an upper surface of the pixel 100r, but the inventive concepts are not necessarily limited thereto. The molding agent 50a may be disposed between the film 50b and the pixel 100r.

The film 50b is disposed on the pixel 100r so as to reduce a step difference between the upper surface of the molding agent 50a and the upper surface of the molding member 50 adjacent thereto. The film 50b may be formed of a single layer or may be formed of a plurality of layers. When the film 50b is formed of the single layer, the film 50b may include an identical or similar material as that of the molding agent 50a, and thus, a bonding strength between the film 50b and the molding agent 50a may be improved. The film 50b formed of the single layer may include light scattering particles therein to prevent glare, and the upper surface thereof may be haze-treated so as to prevent glare. For example, like a film 150a shown in FIG. 11A, an anti-glare layer 60a may be formed by the haze treatment on an upper surface of a body portion 50b' containing an identical or similar material as that of the molding agent 50a.

In other forms, the film 50b may also be formed of a plurality of layers. When the film 50b is formed of the plurality of layers, the plurality of layers may be formed of different materials from one another.

Figure 11A:
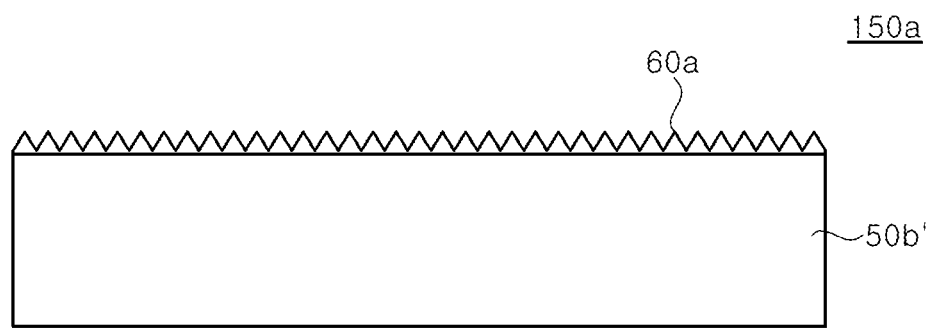
FIG. 11A is a schematic cross-sectional view illustrating a film according to an exemplary embodiment of the present disclosure.
Figure 11B:
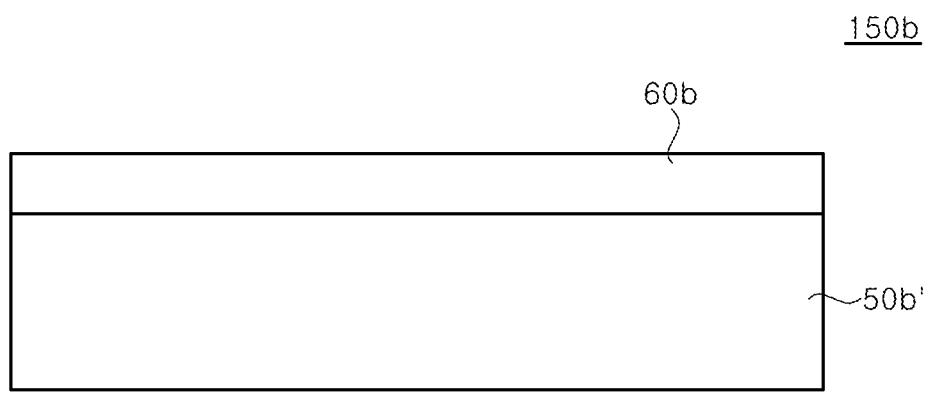
FIG. 11B is a schematic cross-sectional view illustrating a film according to another embodiment of the present disclosure.

For example, like a film 150b shown in FIG. 11B, an anti-glare layer 60b may be additionally disposed over the body portion 50b' formed of a single layer. For example, the film 150b having the body portion 50b' and the anti-glare layer 60b as shown in FIG. 11B may be manufactured by applying a molding agent to an anti-glare film and curing it.

In this case, haze values of the anti-glare layers 60a and 60b are smaller than or equal to 50%, and specifically, the anti-glare layers may have haze values smaller than or equal to 30%. In addition, an anti-glare layer formed by the haze treatment or additional disposition may be also disposed at an upper portion of the molding member 50 adjacent to the film 50b, and the anti-glare layers 60a and 60b over the film 50b as shown in FIGS. 11A-11B may be an identical type of an anti-glare layer as the anti-glare layer at the upper portion of the adjacent molding member 50.

Figure 11C:
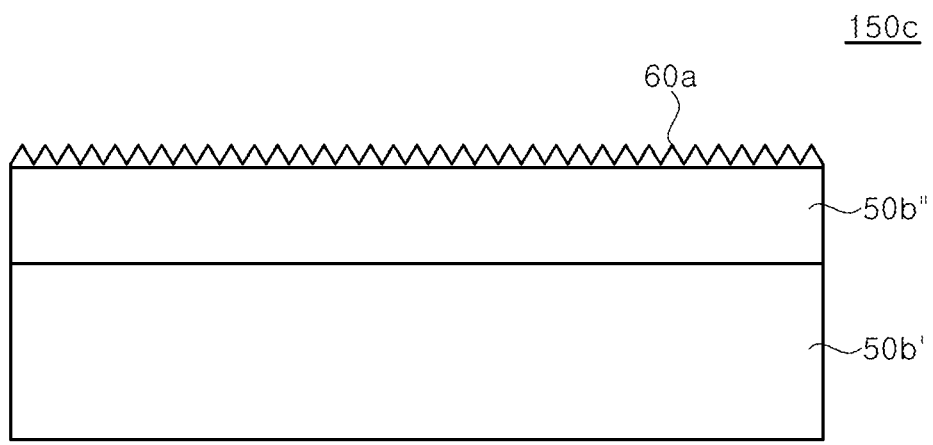
FIG. 11C is a schematic cross-sectional view illustrating a film according to a further exemplary embodiment of the present disclosure.

Like a film 150c shown in FIG. 11C, the film 50b may include a lower layer 50b', an upper layer 50b", and the anti-glare layer 60a. The lower layer 50b' may be formed of a material similar to or identical to that of the molding member 50 or the molding agent 50a (see FIG. 8). That is, the lower layer 50b' of the film 50b may be formed to have a light transmittance or light shielding rate substantially similar to that of the molding member 50 or the molding agent 50a. Accordingly, a bonding strength between the lower layer 50b' of the film 50b and the molding agent 50a may be improved. In addition, the lower layer 50b' of the film 50b may be formed to have a hardness similar to that of the molding member 50 or a molding member (50c in FIG. 9) in which the molding agent 50a is cured. The upper layer 50b" may be formed of a material different from that of the lower layer 50b', and has a hardness different from that of the lower layer 50b'. In this case, the upper layer 50b" of the film 150c may be haze-treated on a surface thereof to form the anti-glare layer 60a. Alternatively, as described with reference to FIG. 11B, the anti-glare layer 60b may be disposed on the upper layer 50b".

When the film 50b includes an anti-glare layer, the anti-glare layer may be formed using an anti-glare film, and the film 50b may be formed by applying a molding agent or bonding a molding member to the anti-glare film. The molding member (50b' in FIG. 11B, or a sum of 50b' and 50b" in FIG. 11C) may be formed to have a thickness excluding a thickness of the anti-glare film from a step difference from the upper surface of the molding member 50 to the upper surface of the molding member 50c formed by curing the molding agent 50a. In this case, the haze values of the anti-glare layers 60a and 60b are smaller than or equal to 50%, and specifically, the anti-glare layers have haze values smaller than or equal to 30% or less. In addition, the anti-glare layers 60a and 60b may be same as the anti-glare layer formed on the adjacent molding member 50.

The film 50b may be attached to the panel substrate 20 by the molding agent 50a. The molding agent 50a may be deformed to have a flat upper surface by the lower surface of the film 50b.

In the illustrated exemplary embodiment, the film 50b and the molding member 50 may be in close contact with each other. However, the inventive concepts are not limited thereto, and a gap may be formed between the film 50b and the molding member 50. The gap may be filled with the molding agent 50a.

Figure 12:
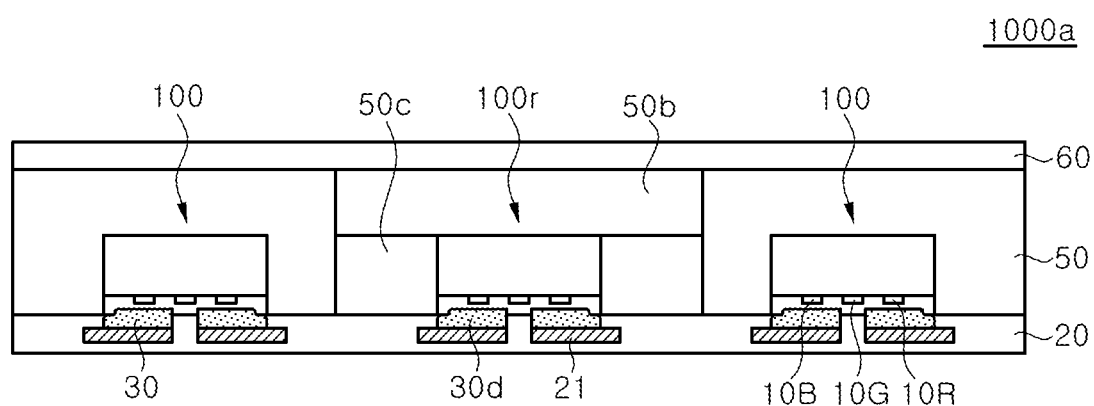
FIG. 12 is a schematic cross-sectional view illustrating a repaired display panel according to another exemplary embodiment of the present disclosure.
Figure 13:
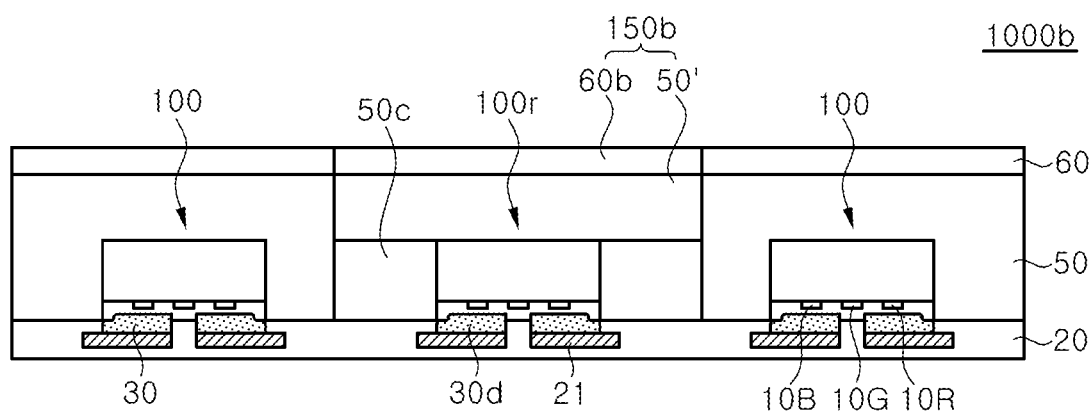
FIG. 13 is a schematic cross-sectional view illustrating a repaired display panel according to a further exemplary embodiment of the present disclosure.

When the film 50b including the anti-glare layers 60a and 60b on the surface thereof is disposed on the molding agent 50a, the anti-glare layer on the film 50b may be spaced apart from the anti-glare layer on the molding member 50 (see FIG. 13). However, the inventive concepts are not limited thereto, and after disposing the film 50b, the anti-glare layer may be formed on the surfaces of the film 50b and the molding member 50, and thus, the anti-glare layer on the film 50b and the anti-glare layer on the surface of the molding member 50 may be continuous (see FIG. 12).

Figure 9:
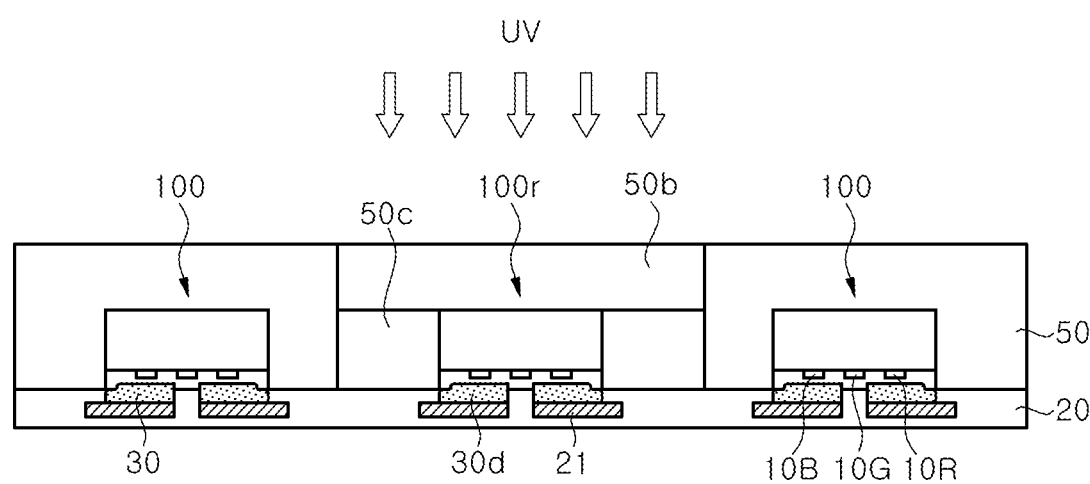

Referring to FIG. 9, the molding agent 50a may be cured. The molding agent 50a may be formed of, for example, an ultraviolet (UV) curing agent, and thus, may be cured by irradiating UV. However, the inventive concepts are not limited thereto, and the molding agent 50*a* may be formed of a thermal curing agent. The molding member 50*c* is formed by curing the molding agent 50*a*, and the film 50*b* is coupled to the molding member 50*c* to be secured on the panel substrate 20.

All of the defective pixels 100*f* disposed on the panel substrate 20 may be replaced with the replacement pixels 100*r*. As such, the repair of the display panel is completed.

In the illustrated exemplary embodiment, the molding member 50*c* and the film 50*b* fill a region of the removed molding member 50*r*. Accordingly, the upper surface of the molding member 50 and the upper surface of the film 50*b* may be formed to be flush with each other. Although it is described in the present disclosure that the film 50*b* and the molding member 50*c* are used together, the inventive concepts are not limited thereto, and the region of the removed molding member 50*r* may be filled in with the molding agent 50*a* without using the film 50*b*. However, by using the film 50*b* together with the molding agent 50*a*, it may be easier to control an amount of the molding agent 50*a*, and also, to provide the flat upper surface, so that the display panel may be repaired more easily.

In the illustrated exemplary embodiment, the removed molding member 50*r* is removed from the molding member 50 so as to remove the defective pixel 100*f*. An area of the removed molding member 50*r* is not particularly limited, but it may have a size in which the pixels 100 are not exposed so as not to affect favorable pixels 100. A width W of one surface of the removed molding member 50*r* may be formed to be greater than a length of a long side of the defective pixel 100*f* (see FIG. 10), and may be formed to be greater than a distance between the defective pixel 100*f* and an adjacent pixel. By way of example, the width W of one surface of the removed molding member 50*r* may be 100 μm or more and 800 μm or less. The width W of one surface of the removed molding member 50*r* may vary according to the length of the long side of the defective pixel 100*f* and the distance between the defective pixel 100*f* and the adjacent pixel. The width W of one surface of the removed molding member 50*r* may be equal to or greater than a width of the molding member 50*c*. In addition, the width W of one surface of the removed molding member 50*r* may be equal to or greater than a width of the film 50*b*. A thickness T of the removed molding member 50*r* may be greater than a thickness of the defective pixel 100*f*, and may be formed to be 120 μm or more and 1000 μm or less. However, the inventive concepts are not limited thereto, and the removed molding member 50*r* may have an area exposing at least a portion of the favorable pixels 100. In this case, the molding agent 50*a* and the film 50*b* may cover the favorable pixel 100 together with the replacement pixel 100*r*. A relatively large film 50*b* may be used, and thus, it may be easier to handle the film 50*b*.

In another exemplary embodiment, at least portions of the pixels 100 adjacent to the defective pixel 100*f* are removed together with the defective pixel 100*f*, and replacement pixels 100*r* may be mounted on locations of the removed pixels 100 and 100*f*.

In the illustrated exemplary embodiment, it has been described that the pixel 100 in the form in which the micro LEDs 10B, 10G, and 10R are modularized is disposed on the panel substrate 20 and the pixel 100*f* is replaced with the replacement pixel 100*r* to repair the display panel. However, the micro LEDs 10B, 10G, and 10R may be disposed on the panel substrate 20, and may result in a faulty micro LED among them. In this case, the display panel may be repaired by replacing the faulty micro LED with a micro LED having a good condition.

Figure 10:
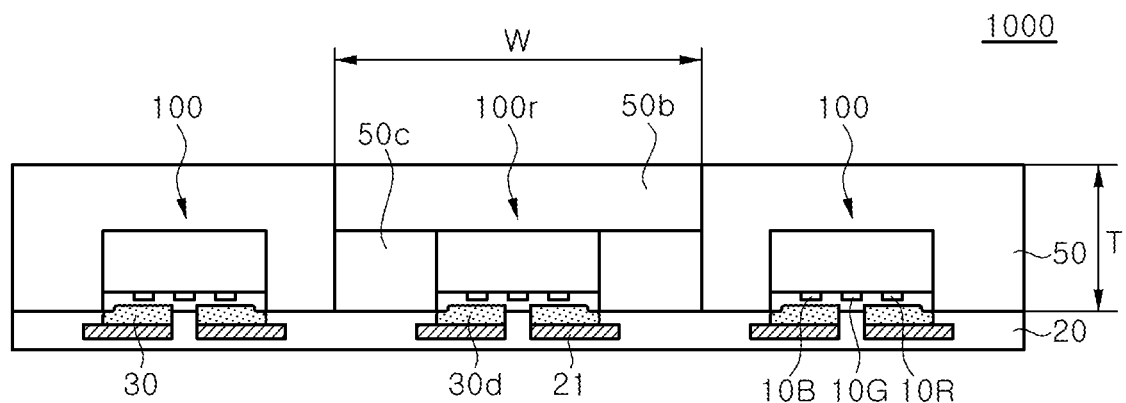
FIG. 10 is a schematic cross-sectional view illustrating a repaired display panel according to exemplary embodiments of the present disclosure.

FIG. 10 is a schematic cross-sectional view illustrating a repaired display panel 1000 according to an exemplary embodiment of the present disclosure.

Referring to FIG. 10, the repaired display panel 1000 may include a panel substrate 20, pixels 100 and 100*r*, a first molding member 50, a second molding member 50*c*, and a film 50*b*.

Since the panel substrate 20, the pads 21, and the bonding portion 30 are identical to those described with reference to FIG. 1, detailed descriptions thereof will be omitted to avoid redundancy.

A bonding portion 30*d* is formed while replacing a defective pixel 100*f* with the replacement pixel 100*r*, and may have a different structure or a different shape from that of the bonding portion 30. For example, a lower portion of the bonding portion 30*d* may have a composition different from that of an upper portion of the bonding portion 30*d*. Also, the bonding portion 30*d* may be thicker than the bonding portion 30. However, the inventive concepts are not limited thereto, and the bonding portion 30*d* may have an identical structure and an identical shape as those of the bonding portion 30.

The replacement pixel 100*r* is a pixel mounted on the panel substrate 20 to replace the defective pixel 100*f*. The replacement pixel 100*r* may have an identical structure as those of the pixels 100, without being limited thereto. The replacement pixel 100*r* may have a structure different from that of the pixel 100.

A height of an upper surface of the replacement pixel 100*r* may be different from those of upper surfaces of the pixels 100. For example, the height of the upper surface of the replacement pixel 100*r* may be higher than those of the upper surfaces of the pixels 100. A difference in heights between the replacement pixel 100*r* and the pixel 100 may be caused by a difference in heights between the bonding portion 30*d* and the bonding portion 30. The difference in heights between the replacement pixel 100*r* and the pixel 100 may be greater than the difference in heights between the film 50*b* and the first molding member 50.

Since the first molding member 70 is identical to the molding member 50 described with reference to FIG. 1, a detailed description thereof will be omitted to avoid redundancy. In addition, the second molding member 50*c* is formed by curing the molding agent 50*a* described with reference to FIGS. 7 and 8, and a detailed description thereof will be omitted. Since the film 50*b* is identical to that described with reference to FIG. 8, a detailed description thereof will be omitted.

The second molding member 50*c* may be formed in a composition different from that of the film 50*b*. The second molding member 50*c* may have, for example, a higher light transmittance than that of the film 50*b*. The second molding member 50*c* may be formed of a transparent resin. The second molding member 50*c* may be formed of an identical or similar material as the first molding member 50. The second molding member 50*c* may cover a side surface of the replacement pixel 100*r*. The film 50*b* may cover the second molding member 50*c* and the replacement pixel 100*r*. The film 50*b* may have a width equal to or greater than that of the replacement pixel 100*r*. In an exemplary embodiment, the film 50*b* may exceed twice an area of the replacement pixel 100*r*. The film 50*b* may overlap the replacement pixel 100*r*, and may be laterally spaced apart from the pixels 100.

However, the inventive concepts are not limited thereto, and the film 50b may overlap at least one pixel 100 adjacent to the replacement pixel 100r.

In another exemplary embodiment, the second molding member 50c may be formed in a composition different from that of the first molding member 50. The composition and/or shape of the second molding member 50c may be different from that of the first molding member 50. The second molding member 50c may have a higher light transmittance than that of the first molding member 50. The second molding member 50c may be formed of a transparent resin, and the first molding member 50 may include a black matrix.

FIG. 12 is a schematic cross-sectional view illustrating a repaired display panel 1000a according to another exemplary embodiment of the present disclosure.

Referring to FIG. 12, the display panel 1000a according to the illustrated exemplary embodiment is substantially similar to the display panel 1000 described with reference to FIG. 10 except for a structure of an anti-glare layer 60.

A plurality of layers 50c, 50b, and 60 of a molding member may be formed in a region of a replacement pixel 100r. The plurality of layers may be formed of a first layer 50c, a second layer 50b, and a third layer 60. The first layer 50c is formed to be in contact with a side surface of at least one LED among a plurality of micro LEDs disposed in the region of the replacement pixel 100r, and the second layer 50b is disposed over the first layer 50c. The third layer 60 is disposed over the second layer 50b. The first through third layers 50c, 50b, and 60 may be formed to have different thicknesses from one another, and at least two of the first through third layers may include regions having an identical thickness.

The first layer 50c and the second layer 50b may be formed of an identical or similar material, and may be formed of a substantially identical material as that of the molding member 50 so as to have a substantially identical light transmittance or light shielding rate as that of the molding member 50. In addition, the third layer 60 may include a material different from that of the first layer 50c or the second layer 50b. The third layer 60 may have a haze value different from those of the first layer 50c and the second layer 50b, and when an upper surface of the molding member 50 is haze-treated, the third layer 60 may have a haze value a substantially identical to that of the upper surface of the molding member. Moreover, when an anti-glare layer is formed at an upper portion of the molding member 50, the third layer 60 has a substantially identical haze value as that of the anti-glare layer formed at the upper portion of the molding member 50. The third layer 60 may be disposed at a substantially identical height as that of the upper surface of the molding member 50. Accordingly, light emitted through the replacement pixel 100r may have characteristics similar to those of light emitted from an adjacent pixel, and light characteristics of an entire display panel may be uniformly maintained.

Furthermore, the third layer 60 may be continuously disposed not only in the region of the replacement pixel 100r but also in a region over the molding member 50.

FIG. 13 is a schematic cross-sectional view illustrating a repaired display panel 1000b according to another exemplary embodiment of the present disclosure.

The display panel 1000b according to the illustrated exemplary embodiment is substantially similar to the display panel 1000a described with reference to FIG. 12, except that an anti-glare layer 60b formed in the region of the replacement pixel 100r is spaced apart from an anti-glare layer 60 formed at an upper portion of the molding member 50.

That is, in the illustrated exemplary embodiment, a film 150b may include a body portion 50b' and the anti-glare layer 60b as shown in FIG. 11B, and the film 150b may be disposed in the region of the replacement pixel 100r. Meanwhile, the anti-glare layer 60 may already be formed on the molding member 50, and thus, when a portion of the molding member 50 is removed in the region of the replacement pixel 100r, the anti-glare layer 60 is removed together with the molding member 50. Thereafter, as the film 150b including the anti-glare layer 60b is disposed in the region of the replacement pixel 100r, the anti-glare layer 60b spaced apart from the anti-glare layer 60 on the molding member 50 may be formed.

In the illustrated exemplary embodiment, it has been exemplarily described that the pixels 100 and 100r in the structure in which the micro LEDs 10B, 10G, and 10R are modularized on the panel substrate 20 are arranged, but the micro LEDs 10B, 10G, and 10R may be directly disposed on the panel substrate 20 instead of the pixels 100 and 100r. These micro LEDs 10B, 10G, and 10R may be combined to form one pixel. In this case, at least one replacement micro LED may be disposed on the panel substrate 20, and the second molding member 50c may cover a side surface of the replacement micro LED.

In addition, in the illustrated exemplary embodiment, it has been illustrated and described as the micro LEDs 10B, 10G, and 10R being laterally spaced apart in the pixels 100 and 100r, but the pixel in the modular form is not limited to a specific structure. In the present disclosure, pixels of any structure capable of emitting various colors may be used. For example, pixels having a structure in which red, green, and blue light emitting diodes are vertically stacked may be arranged on the panel substrate 20.

Various embodiments have been described above, but these embodiments are provided for explanation and should not be construed as limiting the present disclosure. In addition, elements described in an embodiment may be applied to other embodiments without departing from the spirit of the present disclosure.

The invention claimed is:

1. A display panel, comprising:
  a panel substrate;
  a plurality of micro LEDs arranged on the panel substrate;
  a plurality of conductive bonding layers disposed on the panel substrate, wherein each of the plurality of conductive bonding layers is electrically connected to at least one of the plurality of micro LEDs; and
  a molding layer configured to cover the plurality of micro LEDs, wherein:
    the molding layer includes a first molding layer and a second molding layer disposed in a region surrounded by the first molding layer,
    the second molding layer has a composition or a shape different from that of the first molding layer,
    the second molding layer surrounds at least one surface of at least one of the plurality of micro LEDs, and
    at least one of the plurality of conductive bonding layers is thicker than another one of the plurality of conductive bonding layers.

2. The display panel of claim 1, wherein a light transmittance of the second molding layer is higher than a light transmittance of the first molding layer.

3. The display panel of claim 1, wherein a height of an upper surface of the second molding layer is lower than a height of an upper surface of the first molding layer.

4. The display panel of claim 3, further comprising:
  a film covering the second molding layer, wherein:

the film is disposed in the region surrounded by the first molding layer, and a height of an upper surface of the film is substantially equal to the height of the upper surface of the first molding layer.

5. The display panel of claim 4, wherein the first molding layer and the film include at least one anti-glare layer on upper surfaces thereof.

6. The display panel of claim 5, wherein an anti-glare layer disposed on the upper surface of the first molding layer is spaced apart from an anti-glare layer disposed on the upper surface of the film.

7. The display panel of claim 1, comprising:
a plurality of pixels, wherein:
the plurality of pixels has a structure in which the micro LEDs are modularized, respectively, and the second molding layer covers at least one side surface of the at least one of the plurality of pixels.

8. The display panel of claim 7, wherein:
the plurality of pixels includes a replacement pixel, and
the second molding layer covers side surfaces of the replacement pixel.

9. The display panel of claim 8, further comprising:
a film covering the second molding layer, wherein:
the film is disposed in the region surrounded by the first molding layer, and a height of an upper surface of the film is substantially equal to a height of the upper surface of the first molding layer.

10. The display panel of claim 8,
wherein a conductive bonding layer for the replacement pixel is thicker than a conductive bonding layer for other pixels.

11. The display panel of claim 8, wherein an upper surface of the replacement pixel is higher than upper surfaces of other pixels.

12. A display panel, comprising:
a panel substrate;
a plurality of LED pixels arranged on the panel substrate;
a plurality of conductive bonding layers disposed on the panel substrate, wherein each of the plurality of conductive bonding layers is electrically connected to at least one of the plurality of LED pixels; and
a molding layer covering the plurality of LED pixels, wherein:
the molding layer includes a plurality of layers in at least one LED pixel region of the plurality of LED pixels,
the plurality of layers of the molding layer includes a first layer and a second layer disposed over the first layer,
a composition or a shape of a partial region of the second layer is different from a composition or a shape of the first layer, and
at least one of the plurality of conductive bonding layers is thicker than another one of the plurality of conductive bonding layers.

13. The display panel of claim 12, wherein:
each of the plurality of LED pixels includes a plurality of micro LEDs, and the first layer is in contact with at least one side of at least one of the plurality of micro LEDs.

14. The display panel of claim 12, wherein a region over the second layer includes a haze treatment region.

15. The display panel of claim 12, wherein:
the second layer includes an upper layer and a lower layer, and the lower layer includes an identical material as that of the first layer.

16. The display panel of claim 15, wherein the upper layer includes a haze treatment region.

17. The display panel of claim 15, wherein the upper layer includes an anti-glare film.

18. The display panel of claim 15, wherein the upper layer and the lower layer have different thicknesses.

19. The display panel of claim 14, wherein a haze value of the haze treatment region is smaller than or equal to 30%.

20. The display panel of claim 15, wherein the lower layer has an identical light transmittance or light shielding rate as that of the first layer.

* * * * *